United States Patent
Rose et al.

(10) Patent No.: US 9,564,378 B2
(45) Date of Patent: Feb. 7, 2017

(54) DETECTION OF LOST WAFER FROM SPINNING CHUCK

(71) Applicant: TEL FSI, Inc., Chaska, MN (US)

(72) Inventors: Alan D. Rose, Wylie, TX (US); Michael Gruenhagen, Norwood Young America, MN (US)

(73) Assignee: TEL FSI, INC., Chaska, MN (US)

( * ) Notice: Subject to any disclaimer, the term of this patent is extended or adjusted under 35 U.S.C. 154(b) by 0 days.

(21) Appl. No.: 14/566,109

(22) Filed: Dec. 10, 2014

(65) Prior Publication Data
US 2016/0172256 A1    Jun. 16, 2016

(51) Int. Cl.
| | |
|---|---|
| *H01L 21/84* | (2006.01) |
| *H01L 21/66* | (2006.01) |
| *H01L 21/67* | (2006.01) |

(52) U.S. Cl.
CPC .......... *H01L 22/26* (2013.01); *H01L 21/67259* (2013.01)

(58) Field of Classification Search
CPC ............... H01L 22/26; H01L 21/67259; H01L 21/67017; H01L 21/687
USPC ........................................................ 438/151
See application file for complete search history.

(56) References Cited

U.S. PATENT DOCUMENTS

| | | | |
|---|---|---|---|
| 3,538,883 A | 11/1970 | Polin | |
| 5,554,964 A | 9/1996 | Jansseune | |
| 6,168,665 B1* | 1/2001 | Sakai | H01L 21/67017 |
| | | | 118/500 |
| 6,241,577 B1* | 6/2001 | Shibata | B24B 9/14 |
| | | | 451/5 |
| 6,290,569 B1* | 9/2001 | Mizuno | B24B 9/14 |
| | | | 451/43 |
| 2003/0132746 A1* | 7/2003 | Cox | H01L 21/67259 |
| | | | 324/207.26 |
| 2004/0004713 A1 | 1/2004 | Go et al. | |
| 2007/0209684 A1* | 9/2007 | Chen | H01L 21/67253 |
| | | | 134/33 |
| 2013/0152971 A1* | 6/2013 | Kato | H01L 21/68792 |
| | | | 134/21 |
| 2014/0152976 A1 | 6/2014 | VanHoomissen et al. | |

\* cited by examiner

*Primary Examiner* — Long K Tran
(74) *Attorney, Agent, or Firm* — Kagan Binder, PLLC

(57) ABSTRACT

The disclosure relates to systems and methods for detecting when a microelectronic substrate is no longer properly secured or lost from a rotating chuck. A microelectronic substrate may be secured to a rotating chuck that may rotate the substrate when exposing the substrate to the chemicals during a treatment in a process chamber. The rotating chuck may include one or more detectors to detect the position of a gripping mechanism that secure the microelectronic substrate. The detectors may generate an electrical signal that correlates to the position of the microelectronic substrate. When the electrical signal(s) exceed a threshold the system may stop rotating the chuck to prevent additional damage to the process chamber.

13 Claims, 5 Drawing Sheets

DETECTION OF LOST WAFER FROM SPINNING CHUCK

FIELD OF USE

The invention relates to an apparatus and method for treating the surface of a microelectronic substrate, and in particular, an apparatus and method for determining whether a microelectronic substrate is secured in position during the treatment.

BACKGROUND

Integrated circuits (ICs) may be formed on microelectronic substrates, such as semiconductor substrates, with ever increasing density of active components. The ICs may be formed through successive process treatments that form structures that perform electrical functions as needed. The processing of the microelectronic substrates may be automated to secure and treat the microelectronic substrate in a controlled manner. One aspect may include rotating the microelectronic substrate during treatment or processing. The rotation may enable more uniform processing across the microelectronic substrate. However, the rotation speed may be relatively high, such that if the microelectronic substrate becomes unsecured the substrate may break and the processing equipment may be damaged. Hence, it may be desirable to determine when the microelectronic substrate becomes unsecured and to disable the rotation mechanism to reduce the possibility of substrate breakage and to prevent or minimize damage to the equipment caused by the loose microelectronic substrate.

SUMMARY OF THE INVENTION

In the microelectronic device manufacturing industry, devices are manufactured on microelectronic substrates (e.g., semiconductor wafers) that are transferred between, handled, and treated by semiconductor processing equipment. The diameter of the microelectronic substrates may be greater than 150 mm and may be subject to several types of mechanical handling by the process equipment. One aspect of the mechanical handling may include, but is not limited to, rotating the microelectronic substrate during treatment. The mechanical handling may include securing the microelectronic device to a rotating mechanism that may rotate at a speed of at least 50 rpm. In most instances, the secured microelectronic device is treated successfully and removed from the process equipment without incident. However, in some instances, the microelectronic substrate may become unsecured from the rotating mechanism. This may cause breakage of the substrate and damage to the process chamber, which may be increased if the rotating mechanism continues to rotate and projects portions of the broken microelectronic substrate throughout the chamber.

One approach to preventing or minimizing damage to the process equipment, may include a microelectronic substrate detection system that determines whether the microelectronic substrate is secured prior to and during the rotation of the microelectronic substrate. In one embodiment, the microelectronic substrate may be gripped, using any mechanical means (e.g., clamp) that secures the microelectronic substrate in desired position for subsequent treatment that may include rotating the microelectronic substrate. The gripping mechanism positioning may be monitored by the detection system, such that if the mechanism changes position in an undesirable manner, the detection system can shut down the rotation to minimize process chamber damage.

In one embodiment, the rotation mechanism may include at least two gripping components that may secure the microelectronic substrate to the rotating mechanism. The gripping component may mechanically actuate to contact and apply pressure to the microelectronic substrate, such that the microelectronic substrate may not move horizontally or vertically during rotation. However, if the microelectronic substrate becomes unsecured, the mechanical tension applied by the gripping component may also change position or orientation. Accordingly, the detection system may monitor the position of the gripping component(s) and may shut down the rotation mechanism based, at least in part, on the position of the gripping component(s) when a change in position exceeds a threshold amount. The detection system may include magnets and magnetic detectors that are used in combination to determine the position of the gripping component(s) and whether the microelectronic substrate is secured.

In one embodiment, the detection system may include one or more magnets that are coupled to a rotating portion of the rotating mechanism and detection sensors that are coupled to a relatively stationary portion of the process equipment. The detection sensors (e.g., Hall Effect sensor) may monitor the field strength of the magnets as they rotate around the detection sensors during the microelectronic substrate treatment. The detection system may be taught to identify certain field strength readings as indicating the microelectronic substrate is properly secured. Likewise, the detection system may also be taught to interpret certain field strength readings to indicate the microelectronic substrate may not be properly secured. For example, a trigger value or threshold may be set, such that when the field strength exceeds or goes below that trigger value, the rotation mechanism stops rotating, regardless of whether the treatment or process has been completed.

In one embodiment, three or more magnets may be disposed adjacent to the gripping components, such that the movement or orientation of the gripping components alters the position and/or orientation of the magnets relative to the detection sensors. The detection system may identify the position or orientation of the magnets based, at least in part, on the field strength magnitude and/or changes in field strength. In this embodiment, the position of the gripping components may be correlated to field strengths that are indicative of a secure microelectronic substrate. However, when the field strengths exceed, or go below, a threshold amount of a trigger value, this may indicate the microelectronic substrate may no longer be secured to the rotation mechanism. Accordingly, the rotation mechanism may begin to slow down or be shut off to minimize further damage to the process chamber caused by an unsecured microelectronic substrate.

In another embodiment, the magnets may include different polarities, such that the field strength signatures may be polarized and may provide a dual signature capability that may be monitored by the detection system. The polarity differences between the magnets may result in different field strength signatures that may be used to determine whether microelectronic substrate is properly secured to the rotation mechanism. Hence, there may be two types of signals that may be monitored to determine whether the microelectronic substrate is properly secured to the rotation mechanism. The two signals may be used alone or combination to shut down the rotation mechanism. Hence, the detection system may use a threshold value for each signal to trigger shutting down the rotation mechanism.

In another embodiment, the process equipment may include a controller that may include a computer processor and memory component that may store and execute computer-executable instructions to implement the detection system described above. For example, the memory may include a process component that manages or controls the treatment process within a process chamber. A detection component, that may also be stored in memory (but is not required to be), that determines whether the microelectronic substrate is properly secured during the treatment process. In one method embodiment, the controller direct the process equipment to couple the microelectronic substrate to a rotation chuck within the process chamber. The microelectronic substrate may be mechanically secured by a gripping mechanism that actuates between an open and closed position. The rotation chuck may rotate when the controller determines the gripping mechanism is in the closed position. The detection component may determine that the gripping mechanism is in the closed position based, at least in part, on field strength from the magnet detected by the detection sensor (e.g., Hall Effect sensor) that may be proximate to the magnet. The controller may then begin rotating the microelectronic substrate, such that the detection sensor may detect the field strength of the magnet as the magnet passes by the detection sensor. As noted above, the field strength may vary depending on the position of the gripping mechanism. The detection component may compare the field strength signal with a threshold value to determine whether the gripping mechanism may be in the same or similar position. In one embodiment, when the field strength signal is below the threshold value, the microelectronic substrate may be considered secured by the gripping mechanism. However, when the field strength signal crosses over the threshold value, the microelectronic substrate may be considered lost or unsecured by the gripping mechanism. Accordingly, the controller may stop rotating the rotation chuck.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention. Additionally, the left most digit(s) of a reference number identifies the drawing in which the reference number first appears.

DETAILED DESCRIPTION OF SEVERAL EMBODIMENTS

Methods for selectively removing material from a substrate are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic substrate" as used herein generically refers to the object being processed in accordance with the invention. The microelectronic substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation. In addition to microelectronic substrates, the techniques described herein may also be used to clean reticle substrates that may be used to patterning of microelectronic substrates using photolithography techniques.

Figure 1:
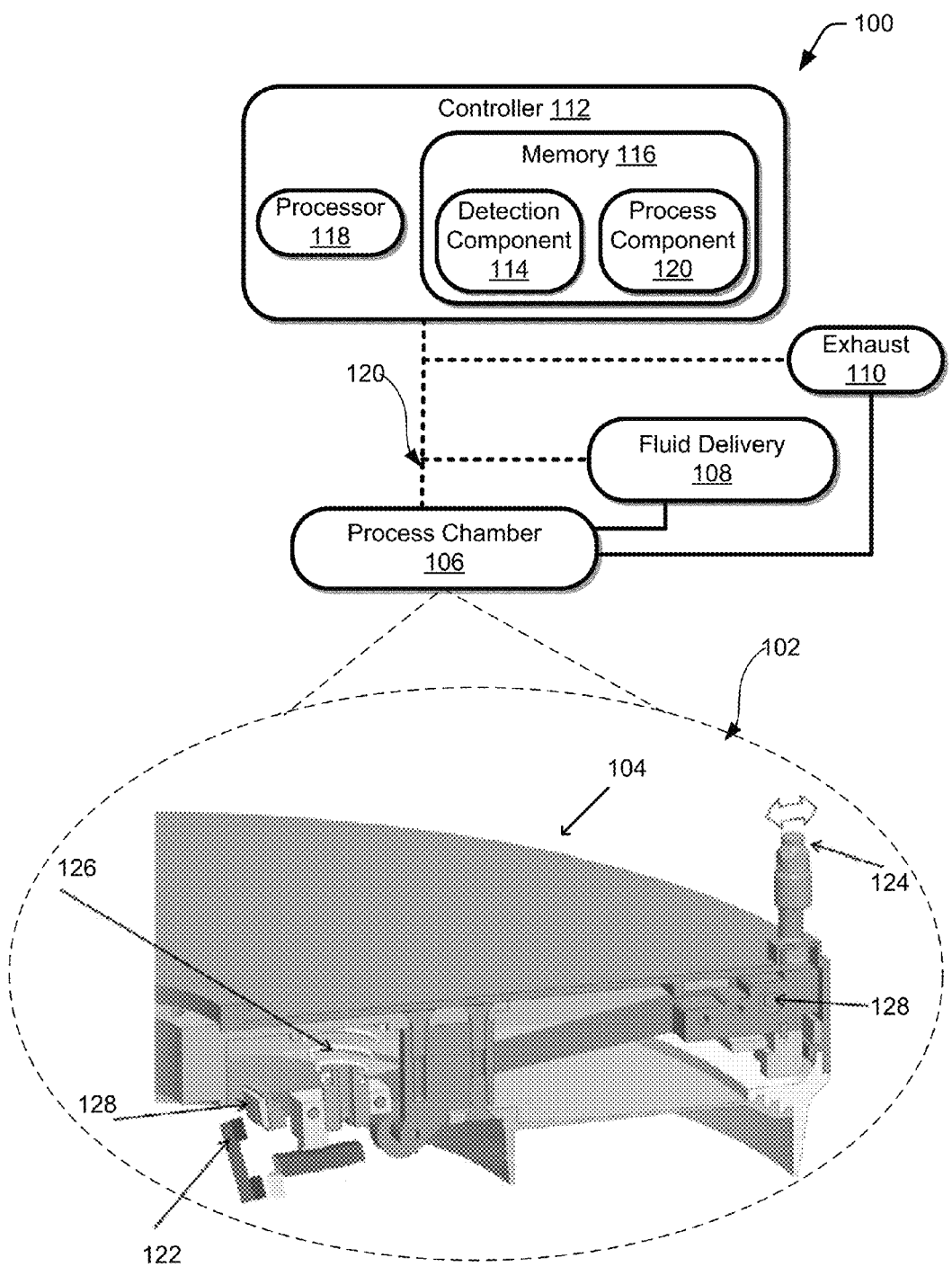
FIG. 1 illustrates a schematic representation of a process system that may include a rotation mechanism and a microelectronic substrate position detection system.

Referring now to the drawings, FIG. 1 provides a schematic illustration of a representative system 100 that may be used to treat microelectronic substrates (not shown) and a cross-section illustration 102 of one embodiment of a rotation chuck 104 used to secure the microelectronic substrate during treatment in a process chamber 106. In one embodiment, the process chamber 106 treatment may include rotating the microelectronic substrate to enable or improve the treatment of the microelectronic substrate. The treatment may include, but is not limited to, a gases and/or chemicals that are exposed to the microelectronic substrate in the process chamber 106. To enable the treatment, the system 100 may include, but is not limited to; one or more fluid delivery systems 108 that may provide various chemical fluids (e.g., gas phase, liquid phase, or combination thereof) that may be exposed to the microelectronic substrate under a variety of conditions (e.g., temperature, pressure, time, etc.). As understood by a person of ordinary skill in the art of chemical processing, the fluid delivery system 108 may include a piping and various control mechanisms that may control the flow, concentration, and/or temperature of the chemical fluids being delivered to the process chamber 106. The system 100 may also include an exhaust system 110 that may remove the chemical fluids or the by-products of the treatment away from the process chamber 106. As understood by a person of ordinary skill in the art, the exhaust system may include various techniques to remove a gas and/or liquid using a pressure differential system that enables the flow of gas or liquid in a certain direction. The exhaust system 110 may also be able to control the chemical's rate of removal from the process chamber 106 using techniques that are known in the art.

The system 100 may also include a controller 112 that may control or manage operations to move the microelectronic substrate in and out of the process chamber 106 and the delivery and removal of chemicals used for the treatment. One aspect of controller 112 may be to monitor the movement of the microelectronic substrate before, during, and/or after the treatment. For example, one treatment condition may include rotating the microelectronic substrate when chemicals are present in the process chamber 106. However, it may be desirable to confirm that the microelectronic substrate is secured to the rotation chuck 104 before, during, and/or after the treatment. The controller 112 may interact with a detection system incorporated into the rotation chuck 104 that may provide an electrical signal to the detection component 114 that may be stored in memory 116. As shown in FIG. 1, the controller 112 may be in electrical communication with the system 100 components over a communications network 120 (e.g., dashed lines).

In this embodiment, the detection component 114 may include computer-executable instructions that may be executed on a computer processor 118 to determine whether the electrical signal indicates that the microelectronic substrate is properly secured to the rotation chuck 104. In a similar manner, the process component 120 may include computer-executable instructions that control or operate the fluid delivery system 108 and the exhaust system 110.

The electrical signal (not shown) provided to the detection component 114 may be provided by a detection sensor 122 that may monitor some aspect of the rotation chuck 104 that indicates that the microelectronic substrate is properly secured. In the FIG. 1 embodiment, the microelectronic substrate may include a gripping mechanism 124 that may be actuated by a mechanical device 126 (e.g., spring) using a pivot joint 128 to apply pressure that secures the microelectronic substrate to the rotation chuck 104. In this instance, the gripping mechanism 124 may move laterally as indicated by the double sided arrow. One indication that the microelectronic substrate may be properly secured is the position of the gripping mechanism 124. The position may be monitored by using a position indicator 128 (e.g., magnet) that may move in conjunction with the gripping mechanism 124. For example, when the microelectronic substrate is lost or removed from the rotation chuck 104, the gripping mechanism 124 may move due to the loss of opposing resistance to the mechanical device 126. The detection sensor 122 may detect the movement and generate the electrical signal that may be interpreted by the detection component 114 to determine the microelectronic substrate is not properly secured. Accordingly, the controller 112 may direct the rotation chuck 104 to stop rotating to prevent additional damage to process chamber 102 caused by the loose microelectronic substrate.

The position indicator 128 may include any component that may be observable by the detection sensor 122 and that may be capable of providing an indication that the gripping mechanism 124 has moved or that the microelectronic substrate is no longer secured to the rotation chuck 104. In one embodiment, the position indicator 128 may be a magnet that emits a magnetic field that may vary in magnitude across the magnet or distance away from the magnet. The detection sensor 122 may be capable of detecting the variations in magnetic field strength and may generate the electrical signal that may be representative of the magnetic field strength. In one instance, the detection sensor 122 may include a Hall Effect sensor that may generate a voltage in response to detecting magnetic field. The voltage magnitude may vary depending on the magnitude of the magnetic field strength. For example, depending on the magnet type, higher field strength may generate a higher voltage and lower field strength may generate a lower voltage. Accordingly, the position of the position indicator 128 may be approximated or correlated with the field strength detected by the Hall Effect sensor. At minimum, the change in magnetic field strength may indicate the position of the position indicator 128 has moved indicating that the gripping mechanism 124 has moved. The movement may be due to the microelectronic substrate no longer being properly secured to the rotation chuck 104.

The interaction between the magnet and the magnetic sensor will be described in greater detail in the description of FIG. 3. One embodiment describing the operation of the detection component 114 and the detection sensor 122 will be described in greater detail in the descriptions of FIGS. 4 & 5.

Figure 2:
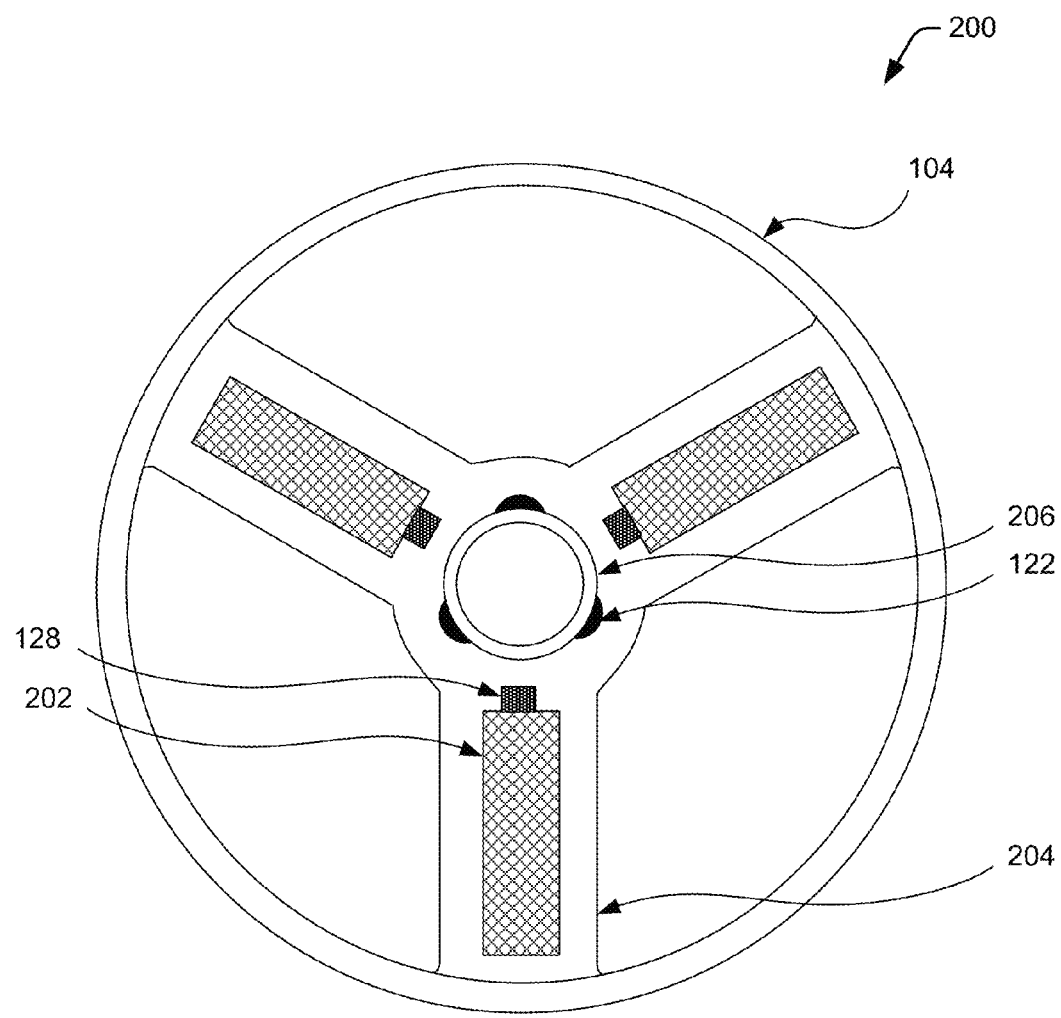
FIG. 2 illustrates a bottom view of one embodiment of a rotation mechanism that includes gripping components, magnets, and detection sensors.

FIG. 2 illustrates one embodiment of the rotation chuck 104 from a bottom view perspective 200 that may include a combination of detection sensors 122 and position indicators 128. Although three pairs of detection sensors 122 and position indicators 128, the total number of pairs may vary and the pairing between detection sensors 122 and the position indicators 128 are not required. For example, multiple position indicators 128 may be used with a single position detector 122 and vice versa.

In the FIG. 2 embodiment, the rotation chuck 104 may include three gripping mechanisms (not shown) coupled to respective actuation mechanisms 202 that may apply pressure to secure the microelectronic substrate (not shown). The actuation mechanisms 202 may be secured to respective mounting arms 204 that may provide support or leverage, such that the position indicators 128 may move in a vertical direction, horizontal direction, or a combination of both with respect to the mounting arms. For example, as the mounting arms 202 may be positioned to secure the microelectronic substrate, the position indicators 128 may be positioned within a known distance of the detection sensors 122. In this way, the detection sensors 122 may be able to detect and generate an electrical signal that may be able to be used to identify the position using the detection component 114. As the position indicators 128 rotate around the center assembly 206, the stationary detection sensors 128 may generate electrical signals for each of the position indicators 128 as they pass by and provide an observable signal that indicates their position. In the magnet embodiment, the observable signal may be a magnetic field that may be detected by a Hall Effect sensor (e.g., detection sensor 122). However, in other embodiments, the observable signal may include light, voltage, power, current, heat, or a combination thereof. The detection sensors 122 and the position indicator 128 may be appropriately configured to generate and/or detect the observable signal that may be provided to the controller 112.

Figure 3:
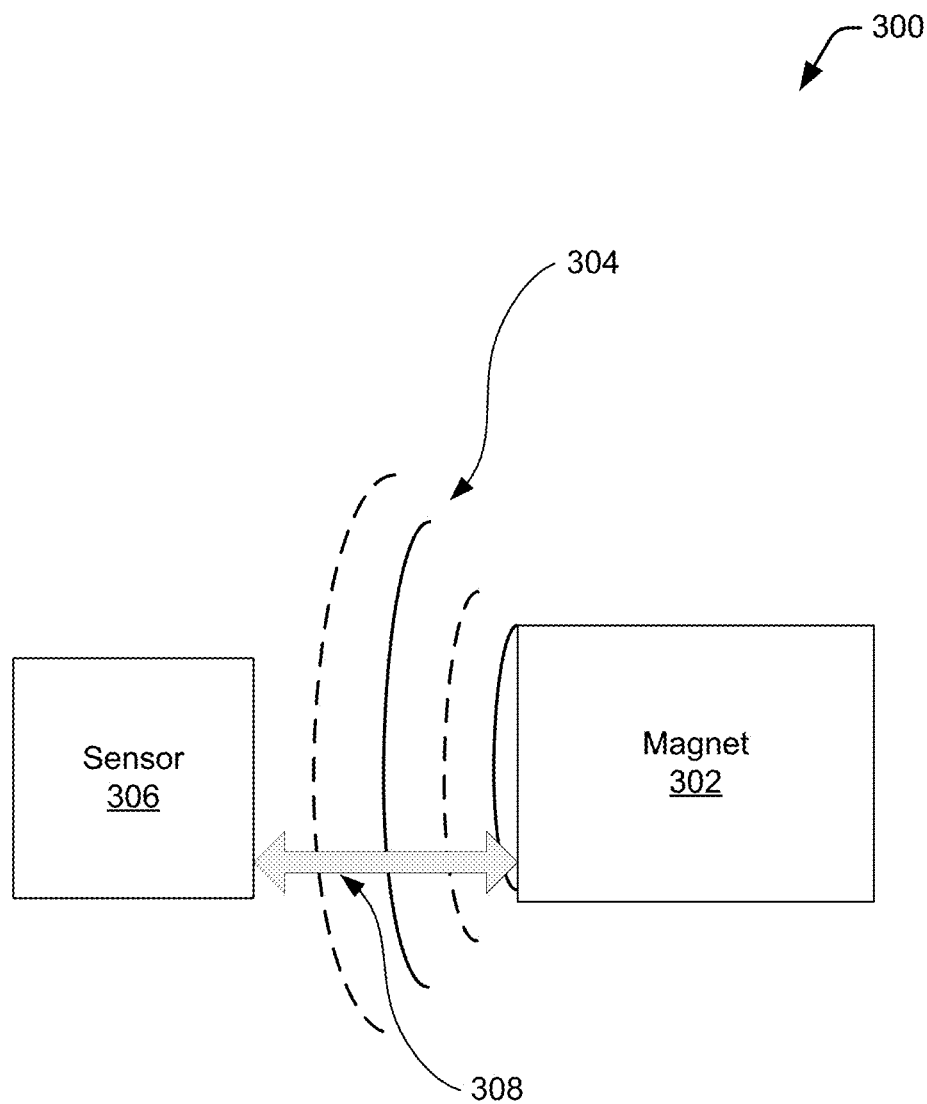
FIG. 3 illustrates a schematic representation of a detection sensor and a magnetic component used by the process system to detect the position of the microelectronic substrate.

FIG. 3 illustrates a schematic representation of a detection sensor 122 (e.g., Hall Effect sensor) and a position indicator 128 (e.g., magnet) used by the process system 100 to detect the position of the microelectronic substrate (not shown) with respect to the rotation chuck 104 (not shown).

In this embodiment, the magnet 302 may emit a magnetic field 304 that may be detected by the Hall Effect sensor 306. The field strength of the magnetic field 304 may vary with distance, such that the relative position 308 between the magnet 302 and the Hall Effect sensor 306 may be correlated to magnitude of the field strength. The Hall Effect sensor 306 may generate a voltage or electrical signal that may be indicative of the relative position 308. Although the relative position 308 is illustrated as a horizontal distance, the relative position may be altered within x, y, and z directions. The position may be altered in any way that enables the Hall Effect sensor 306 to detect the magnetic field (e.g., observable signal) emitted from the magnet 302. The detection component 114 may be configured to correlate any portion of the magnetic field to a magnitude that indicates that the microelectronic substrate is securely held by the rotation chuck 104.

In one embodiment, the magnets 302 may vary in polarity, such that the magnetic field detected by the Hall Effect sensor 306 may cause two different types of electrical signals to generated and provided to the detection component 114. An example of this embodiment will be described in the description of FIG. 4.

In other embodiments, the observable signal may not be a magnetic field. For example, light may be emitted from or pressure exerted by the position indicator 128 that may be detected by an appropriate detection sensor 122. For instance, the intensity of light may be detected by a photosensor (not shown) and a pressure transducer (not shown) may be used to detect the changes in pressure. However, the detection component 114 may be configured to correlate the observable signals to the position of the gripping mechanism 124 and whether the microelectronic substrate is properly secured by the rotation chuck 104.

Figure 4:
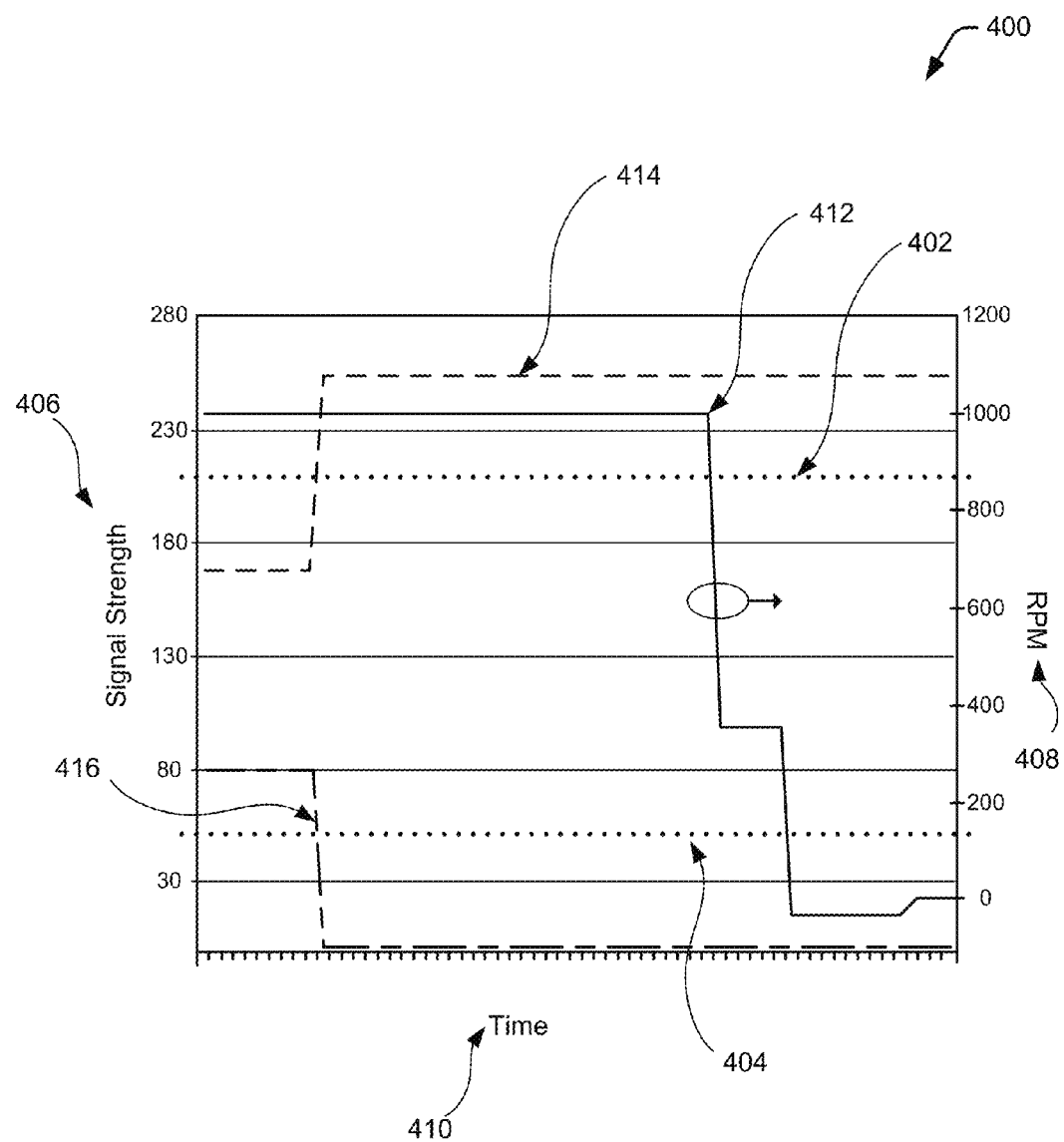
FIG. 4 illustrates a graph that illustrates one embodiment of a method to determine when the rotation mechanism may be disengaged.

FIG. 4 includes a graph 400 that illustrates one embodiment of a method to determine when the rotation chuck 104 may stop rotating based, at least in part, on signals received by the detection component 114 from the detection sensor 122. Broadly, the detection component 122 may monitor the signals from the detection sensor(s) 122 and may compare them to one or more threshold levels (e.g., south polarity threshold 402, north polarity threshold 404).

The different threshold levels may be associated with magnets with different polarity. In one embodiment, the rotation chuck 104 may include a plurality of position indicators 128 that may include with different observable characteristics. For example, the position indicators 128 may include, but are not limited to, magnets with different polarity (e.g., North or South) that may result in different electrical signals that may be correlated to the same position of the gripping mechanism 124. The electrical signals may be used alone or in combination by the detection component 114 to determine whether to stop the rotating chuck 104.

The graph 400 includes a combination of information related to the signal strength (e.g., signal axis 406), rotation chuck's 104 revolutions per minute (e.g., rpm axis 408), and time (e.g., time axis 410). Time is increasing from left to right along the time axis 410 and the graph 400 starts during mid-treatment with the rotation chuck 104 rotating at 1000 rpm per the rpm plot 412. The signal strength for a south magnet 414 (e.g., detection sensor 122) starts at just below 180 and the north magnet 416 (e.g., detection sensor 122) starts at about 80. As noted above, the signal strength may be generated by a Hall Effect sensor 306 that generates a voltage that correlates to the observable signal (e.g., magnetic field 304) from the magnets 302. The magnitudes illustrated in the graph 400 are intended for the purpose of explanation and not are intended to limit the scope of claims to the values on the signal axis 406, the rpm axis 408, or the time axis 410.

In the FIG. 4 embodiment, the detection component 114 may be monitoring the south magnet 414 signal and the north magnet 416 signal. The detection component 114 may be comparing the signals to their respective threshold values. For example, when the south magnet signal ramps to about 240 and crosses the south polarity threshold 402 the detection component 114 may determine the microelectronic substrate is unsecured and direct the rotation chuck 104 to stop rotating. The transition to ramp down is shown at the ramp down point 412 that ends at zero rpms. In another embodiment, the detection component 114 may use the north magnet 416 signal to determine that the microelectronic substrate is not secured. As shown in FIG. 4, the north magnet 416 signal may cross the north polarity threshold level 404 and the detection component 114 may direct the rotating chuck 104 to stop rotating. In yet another embodiment, the detection component 114 may use both the south magnet 414 and the north magnet 416 signals in combination to determine that the microelectronic substrate is not properly secured. In this instance, both the south magnet 414 signal and the north magnet signal 416 should cross their respective threshold levels before the detection component 114 stops the rotating chuck 104.

The threshold levels (e.g., south polarity threshold 402, etc.) may be determined through experiment or teaching of the gripping mechanism 124. In this way, the threshold levels may be determined by gripping a microelectronic substrate with the rotating chuck 104 and setting a grip set point in the detection component. Then slowly releasing the microelectronic substrate until it is loose and setting that voltage from the Hall Effect sensor 306 in the detection component 114 as the threshold level that triggers the stopping of the rotating chuck 104 during treatment, as shown in FIG. 4.

In another embodiment, the threshold levels may be based on set deviation amount, such as a percentage change in the incoming magnet signals. For example, if the magnitude of the signals deviates by more than 10% or 20% the detection component 114 may determine the microelectronic substrate is not properly secured and stop the rotating chuck 104. In other embodiments, the signals may be normalized to reduce the influence of outlier events (e.g., unexpected signal peaks) and provide better control of the rotating chuck 104 by preventing false shutdowns.

Figure 5:
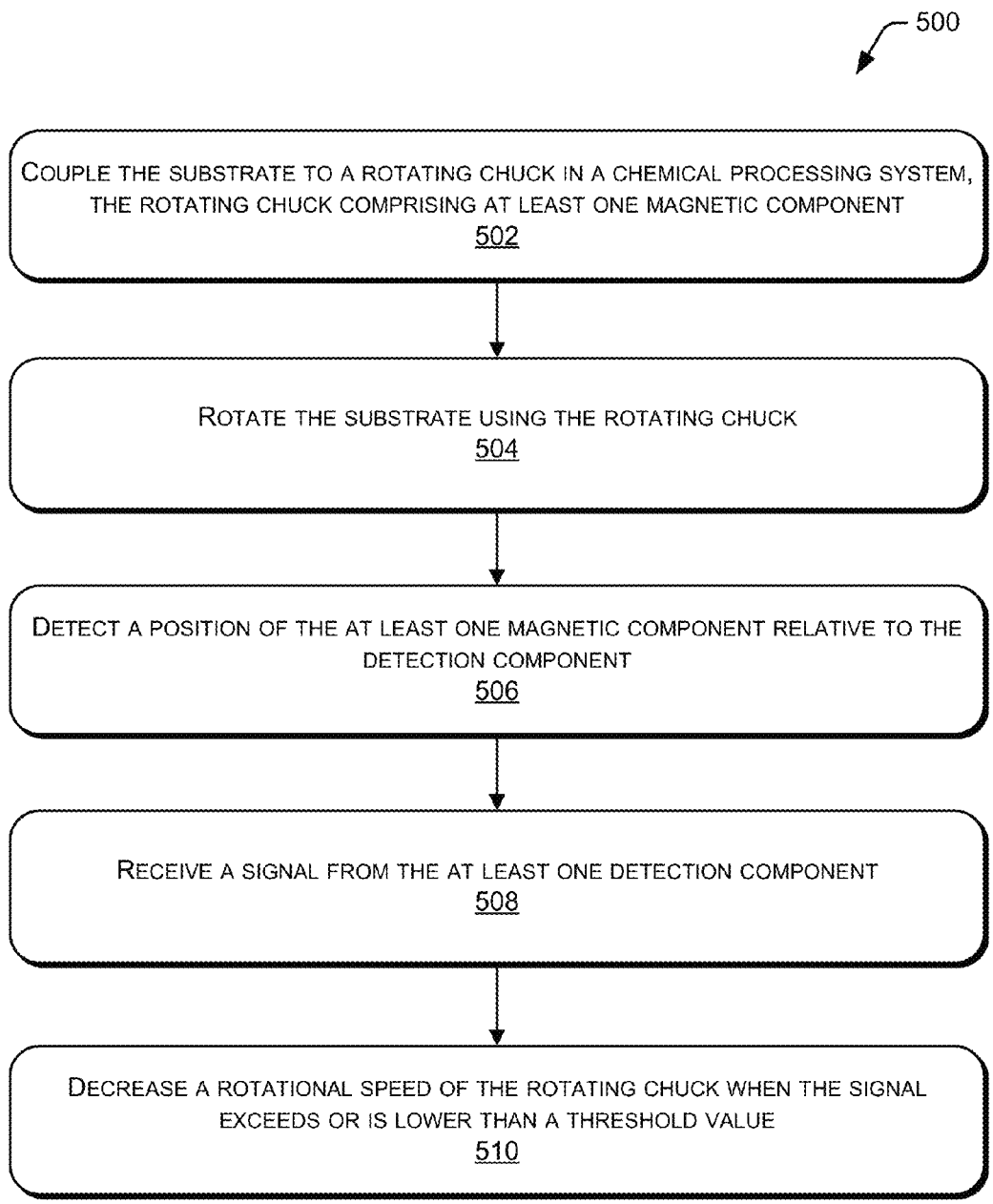
FIG. 5 illustrates a flow diagram for one method for detecting whether a microelectronic substrate is secured in a rotation mechanism.

FIG. 5 illustrates a flow diagram 500 for one method for detecting whether a microelectronic substrate is secured in a rotation chuck 104 and stopping the rotation when the microelectronic substrate is determined to lost or unsecured. As noted above, the controller 112 may be used to control the rotating chuck 104 and its gripping mechanism 124. The controller 112 may also determine whether the microelectronic substrate is properly secured to the rotating chuck 104. One way to implement this embodiment described in the flow diagram 500.

At block 502, the system 100 may include handling mechanism that may transfer the microelectronic substrate from carrying cassette to the process chamber 106. The handling mechanism may place the microelectronic substrate on the rotating chuck 104 and the controller 112 may actuate the gripping mechanism 124 prior to treating the microelectronic substrate.

In one embodiment, the rotating chuck 104 may include a position indicator 128 that may be coupled to the gripping mechanism 124. The position indicator 128 may be positioned in a certain manner that indicates the microelectronic substrate is secured to the rotating chuck 104. For example, the gripping mechanism 124 may move from an open position to a closed position. The movement between the open position and the closed position may also move the position indicator 128 relative to a detection sensor 122. The controller 112 may receive a signal from the detection sensor that may be interpreted to indicate whether the microelectronic substrate is properly secured.

At block 504, the controller 112 may direct the rotating chuck to rotate when detection component 114 determines that that microelectronic substrate is properly secured by the gripping mechanism 124. As noted above, the detection component 114 may compare the signal from the detection sensor 122 with a value or signature stored in memory 116.

At block 506, the detection sensor 122 may continue to detect a signal from or a position of the position indicator 128 when the rotating chuck 124 is rotating during the treatment of the microelectronic substrate.

In one embodiment, the position indicator 128 may include one or more magnets that may be moved or positioned when the gripping mechanism 124 is actuated to secure the microelectronic substrate. The magnet(s) may be made of ferromagnetic materials (e.g., iron, nickel) that have been magnetized and may have a north or south polarity that may indicate the direction of the magnetic field emitted from the magnet. The magnetic field that may have a distance or location dependent signature that may indicate the position of the magnet relative to the detection sensor 122. For example, the magnetic field may be characterized based on how it impacts its environment. In one embodiment, the magnetic field may be characterized as a force that is exerted on a moving charged particle, such that magnetic field may induce the movement of electrons and generate current flow within another non-contacting object. The magnitude of the current flow may indicate the strength of the magnetic field, which may be used to determine the distance from the non-contacting object. In this way, the current flow may be used to approximate the location of the magnet. For example, the gripping mechanism 124 location may be inferred based on the current generated in the detection sensor 122 by the proximate magnetic field.

At block 508, the controller 112 may receive a signal from at least one detection component 122 that may be proximate to the position indicator 128, while the rotating chuck 104 is rotating. The signal may reflect the magnetic field strength from the magnet(s), such that the position of the gripping mechanism 124 may be approximated. The approximation may infer whether the microelectronic substrate is securely connected to the rotating chuck 104, such that the microelectronic substrate rotates at about the same speed as the rotating chuck 104 and/or maintains a stable x-y-z location relative to the fluid delivery system 108 ports or inlets.

In this embodiment, the signal may have a first signature that may be associated with a properly secured microelectronic substrate. The controller 112 may continue to rotate the rotating chuck 104, when this first signature signal is detected or analyzed by the detection component 114. However, the controller 112 may respond or take action when the first signature signal is replaced by a second signature signal.

At block 510, the controller 112 may decrease the rotational speed of the rotating chuck 104 when the second signature signal is detected. In one embodiment, the second signature signal may be any value that exceeds or is lower than a threshold value that indicates the microelectronic substrate may be no longer properly secured by the rotating chuck 104. The interaction between the threshold values and the signal(s) are described above in the description of FIG. 4.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method for treating a microelectronic substrate, comprising:
   securing the microelectronic substrate to a rotating chuck in a chemical processing system using a gripping mechanism that grips the microelectronic substrate in a desired position in a manner such that the position of the gripper mechanism changes if the microelectronic substrate is unsecured;
   rotating the microelectronic substrate using the rotating chuck;
   detecting a position of the gripping mechanism as the rotating chuck rotates;
   using the detected position of the gripping mechanism to determine if the microelectronic substrate is unsecured from the rotating chuck; and
   decreasing a rotational speed of the rotating chuck if the detected position of the gripping mechanism indicates the microelectronic substrate is unsecured.

2. The method of claim 1, further comprising at least one position indicator provided on the gripping mechanism and wherein the position indicator comprises a magnet having a magnetic field.

3. The method of claim 2, wherein the at least one detection component comprises a magnetic field detection sensor and wherein the at least one detection component detects a field strength of the magnetic field.

4. The method of claim 2, wherein the detection of the position indicator component is based, at least in part, on a magnetic field strength detected by the detection component.

5. The method of claim 3, wherein the field strength detected by the at least one detection component indicates the position of the at least one position indicator component relative to the at least one detection component.

6. The method of claim 1, further comprising at least one position indicator is provided on the gripping mechanism and wherein the at least one position indicator component comprises at least two magnets with different polarity.

7. The method of claim 1, further comprising at least one position indicator provided on the gripping mechanism and wherein the at least one position indicator component comprises a light emitting component.

8. The method of claim 7, further comprising using at least one detection component to detect light emitted by the light emitting component, wherein the at least one detection component comprises a photosensor.

9. A system comprising a rotating check and one or more tangible non-transitory computer-readable media that store computer processor executable instructions that, when executed by a computer processor, cause the system to implement a method comprising:

rotating a microelectronic substrate using the rotating chuck, wherein a gripping mechanism grips and secures the microelectronic substrate to the rotating chuck, wherein the gripping mechanism grips the microelectronic substrate in a desired position in a manner such that the position of the gripper mechanism changes if the microelectronic substrate is unsecured;

detecting a position of the gripping mechanism as the chuck rotates;

using the detected position of the gripping mechanism to determine if the microelectronic substrate is unsecured from the rotating chuck; and decreasing a rotational speed of the rotating chuck when the detected position indicates the microelectronic substrate is unsecured.

10. The system of claim 9, further comprising a position indicator provided on the gripping mechanism, wherein the at least one position indicator component comprises a magnet having a magnetic field.

11. The system of claim 10, wherein the detecting step comprises using at least one detection component to detect a position of the position indicator using a magnetic field detection sensor.

12. The system of claim 10, wherein the step of detecting the position of the gripping mechanism comprises using a detection component to detect the magnetic field strength.

13. The system of claim 12, wherein the magnetic field strength correlates to the position of the gripping mechanism.

* * * * *